United States Patent [19]

Mogi

[11] 4,139,840

[45] Feb. 13, 1979

[54] LADDERLESS D/A CONVERTER

[75] Inventor: Takao Mogi, Tokyo, Japan

[73] Assignee: Sony Corporation, Tokyo, Japan

[21] Appl. No.: 764,059

[22] Filed: Jan. 31, 1977

[30] Foreign Application Priority Data

Jan. 29, 1976 [JP] Japan .................................. 51-8685

[51] Int. Cl.² ........................................... H03K 13/02
[52] U.S. Cl. ........................ 340/347 DA; 235/92 PE;
235/92 T; 340/347 M
[58] Field of Search ................... 340/347 AD, 347 M;
235/92 T, 92 TF, 92 FQ, 92 PE, 92 EV

[56] References Cited

U.S. PATENT DOCUMENTS

| 3,646,545 | 2/1972 | Naydan et al. | 340/347 NT |
| 3,648,275 | 3/1972 | Bower | 340/347 M |
| 3,786,488 | 1/1974 | Ahlgren | 340/347 DA |

Primary Examiner—Thomas J. Sloyan
Attorney, Agent, or Firm—Lewis H. Eslinger; Alvin Sinderbrand

[57] ABSTRACT

This digital-analog converter receives a digital number and applies it to a counter capable of handling an n-bit binary capacity. When the counter counts to its full number, e.g. 1111 for a 4-bit capacity a writing signal generated in a control section causes the complement of the applied number to be written into the counter. The counter is then able to start counting from this complement number to the full (1111) number again. The control section then complements the written-in number back to the original number and counts up to the full number yet again. Thus, if the original binary number is 1100 and the reverse number, the counter counts 1100 and 0011 repetitively. At each count reversal, a flip-flop reverses, and a pulse corresponding in length to the original number is produced within each full count interval and that pulse is filtered by a low-pass filter to produce an analog signal corresponding to the original digital one.

4 Claims, 2 Drawing Figures

LADDERLESS D/A CONVERTER

BACKGROUND OF THE INVENTION

Field of the Invention

This invention relates to a digital-to-analog (D/A) converter, and particularly to a simplified D/A converter in which an input digital signal is converted to a rectangular wave signal that has a pulse width corresponding to its code. The rectangular wave signal is smoothed by a low-pass filter to obtain an analog signal.

RELATED PATENT APPLICATIONS

The invention described in detail hereinafter is suitable for use with circuits described in the following applications and others:

U.S. patent application Ser. No. 716,702, filed Aug. 23, 1976; and

U.S. patent application Ser. No. 752,427, filed Dec. 20, 1976, entitled Channel Selecting Apparatus, by T. Mogi.

OBJECTS AND SUMMARY OF THE INVENTION

It is a main object of this invention to provide an improved D/A converter of simple construction.

In accordance with this invention a binary encoded voltage condition corresponding to a number having not more than a certain number of bits, e.g. a 4-bit number in a 4-bit system, is applied to a circuit capable of reversing the polarity of the system or complementing the number, e.g. from 1100 to 0011. The reversing circuit holds the number in readiness at the input terminals of a (in this example) 4-bit counter until the counter counts timing pulses to its largest value and then loads the complement of the applied number into the counter in parallel loading form. A control circuit then directs the continued counting until the counter reaches its maximum count again.

The circuit also includes a flip-flop that reverses polarity each time the counter reaches a specified count. The first two polarity reversals create a single pulse having the duration equal to the difference between the time to count from the polarity-reversed equivalent of the desired number to the full count. Immediately upon reaching the full count the second time, the reversing circuit reverses the polarity of the complementary number loaded on the counter so that the counter is re-loaded with the same number as was originally applied in binary form to the input terminals of the converter. The flip-flop reverses at the same time and the counter immediately starts to count up to its full count again.

By these successive reversals of the flip-flop, a rectangular wave is generated, one part of which has one polarity that has a duration equal to a successive number of counts equal to the numerical value of the number to be converted. The other part of the rectangular wave has a duration equal to the numerical value of the difference between the full count and the numerical value of the one part.

DESCRIPTION OF A PREFERRED EMBODIMENT OF THE INVENTION

Figure 1:
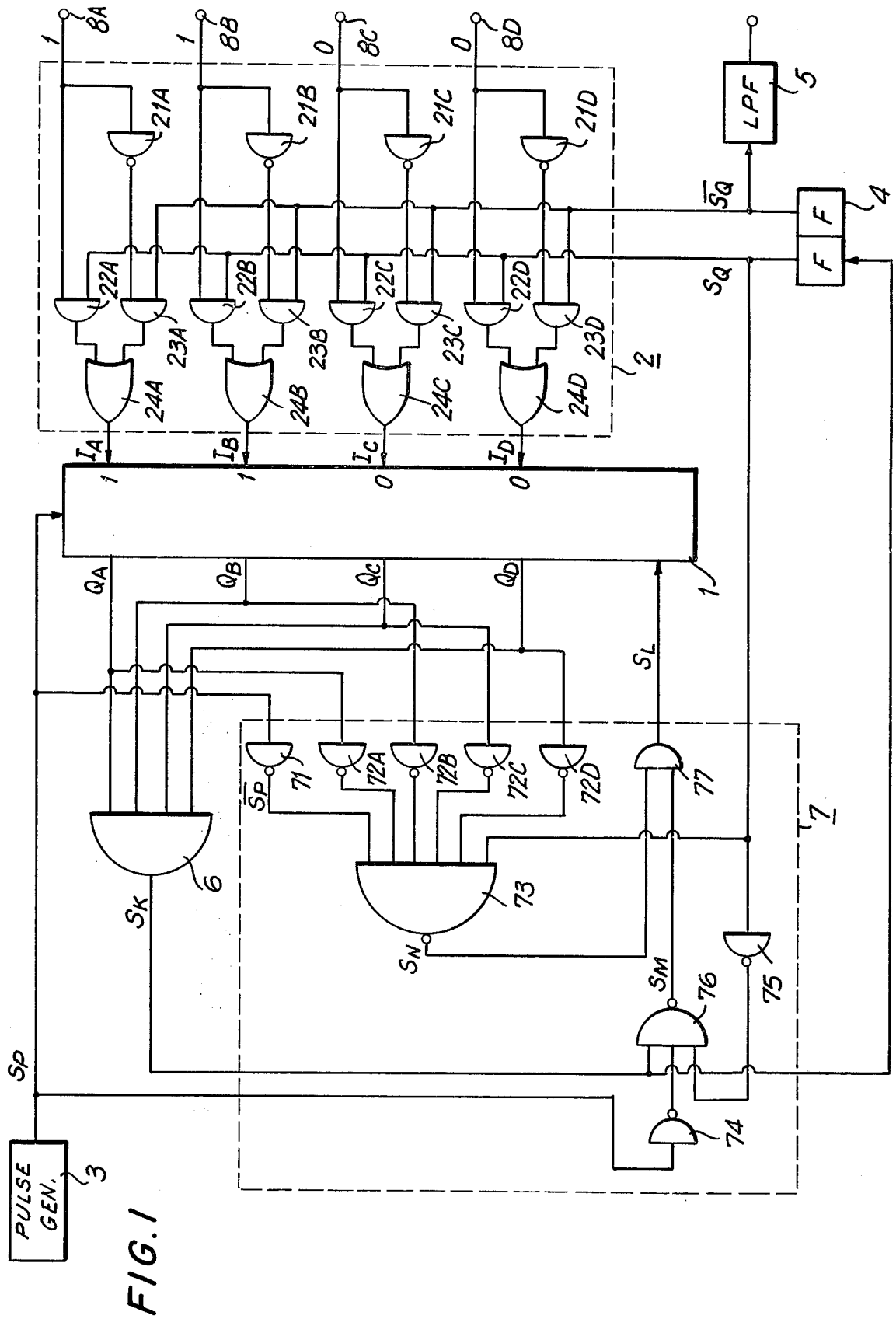
FIG. 1 is a block diagram of a D/A converter according to this invention.

The A/D circuit in FIG. 1 includes a counter 1, a polarity reversing circuit 2, a pulse generator 3, a flip-flop circuit 4, a low-pass filter 5 for rectifying or smoothing the output of the flip-flop circuit 4, and an AND gate 6 having separate input terminals, each connected to a respective one of the counter output terminals, which are identified by output signals $Q_A$, $Q_B$, $Q_C$ and $Q_D$, of the counter 1 to derive therefrom its logic output signal of the AND gate 6. The logic output is applied to the flip-flop circuit 4 to reverse the state of conductivity of that circuit. Also included in the A/D circuit is a pulse shaping circuit 7 for supplying a loading pulse.

The polarity reversing, or complementing, circuit 2 consists of inverters 21A to 21D, AND gates 22A to 22D and 23A to 23D, and OR gates 24A to 24D. Signals consisting of respective bits of an input binary code are supplied through the input terminals 8A to 8D to the AND gates 22A to 22D and through the inverters 21A to 21D to the AND gates 23A to 23D. One output signal $S_Q$ of the flip-flop circuit 4 is supplied to the other input terminals of the AND gates 22A to 22D and the other output signal $\bar{S}_Q$ is supplied to the other input terminals of the AND gates 23A to 23D, respectively. Output signals of the AND gates 22A to 22D are fed to one input terminal of each of the OR gates 24A to 24D, respectively, and output signals of the AND gates 23A to 23D are fed to the other input terminal of each of the OR gates 24A to 24D, respectively.

Meanwhile, output signals $I_A$ to $I_D$ of the OR gates 24A to 24D are fed to the input terminals of the counter 1 so that an output code ($I_A$ $I_B$ $I_C$ $I_D$) of the polarity reversing circuit 2 may be reversed when the output signals $S_Q$ and $\bar{S}_Q$ of the flip-flop circuit 4 are reversed.

The circuit 7 for producing the writing loading pulse consists of inverters 71, 72A to 72D, 74 and 75, NAND gates 73 and 76, and an AND gate 77. The output signals $Q_A$ to $Q_D$ of the counter 1 are supplied respectively through the inverters 72A to 72D to the NAND gate 73 while an output pulse $S_P$ of the pulse generator 3 is supplied through the inverter 71 to the NAND gate 73. Further, the output signal $S_Q$ of the flip-flop circuit 4 is also applied to the NAND gate 73. The output signal $S_K$ of the AND gate 6 is applied to the NAND gate 76, and the pulse $S_P$ and the signal $S_Q$ are supplied respectively through the inverters 74 and 75 to the NAND gate 76. An output signal $S_N$ of the NAND gate 73 and an output signal $S_M$ of the NAND gate 76 are supplied to the AND gate 77 and the resulting output signal $S_L$ of the AND gate 77 is fed to the counter 1 as the writing pulse.

Figure 2:
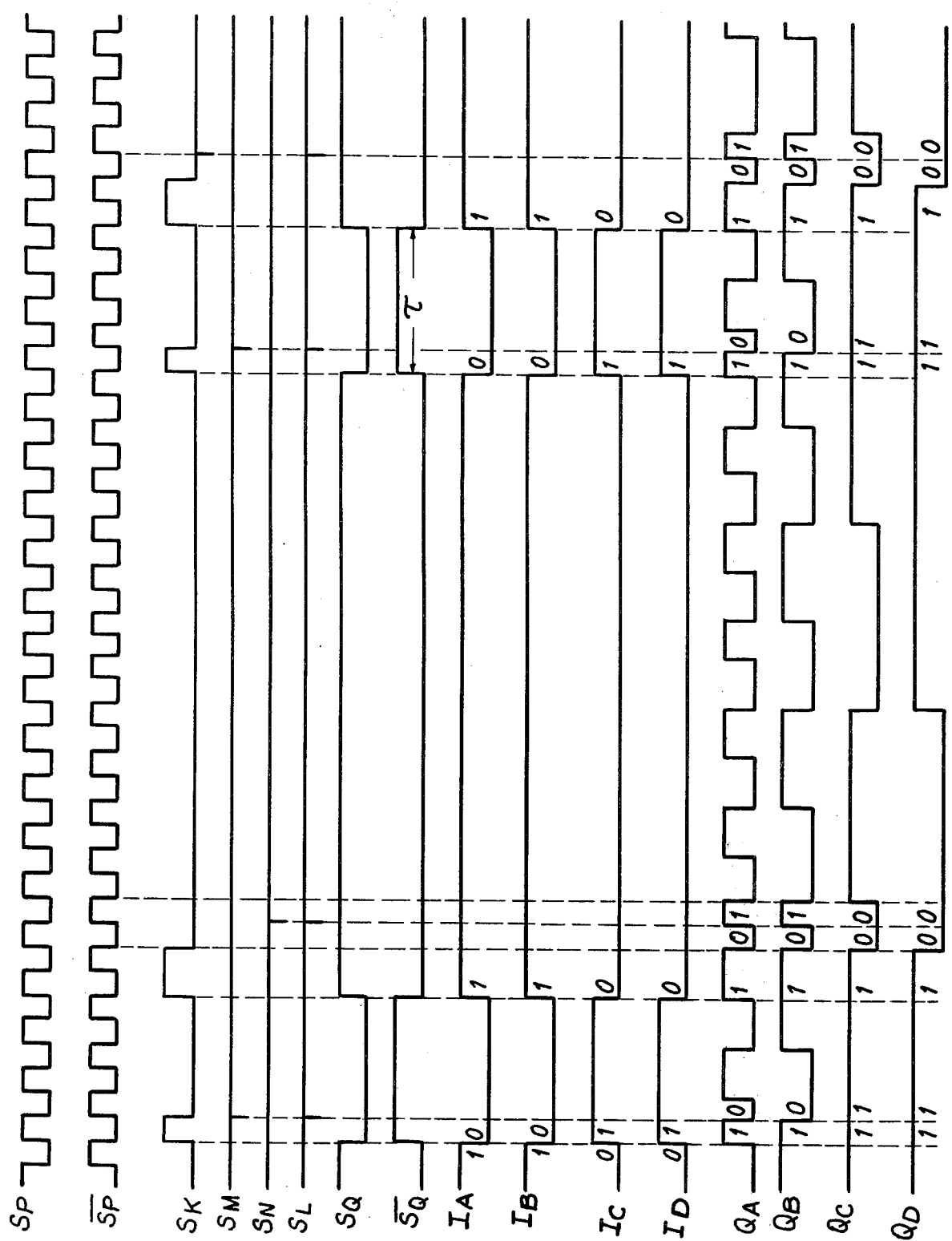
FIG. 2 is a waveform diagram used to explain the operation of the circuit in FIG. 1.

In operation, when an input code supplied from the terminals 8A to 8D is, for example, the binary number 0011 (since terminal 8D receives the the most significant bit and terminals 8C, 8B, and 8A receive successively lower significant bits) and the output, signals $S_Q$ and $\bar{S}_Q$ of the flip-flop circuit 4 are respectively "1" and "0" as shown in FIG. 2, the output signals $I_A$ to $I_D$ of the polarity reversing circuit 2 become "1", "1", "0" and "0", respectively, which signals are supplied to the counter 1.

The pulse $S_P$(refer to FIG. 2) from the pulse generator 3 is applied to the counter 1 to be counted until the output code ($Q_D$ $Q_C$ $Q_B$ $Q_A$) of the counter 1 becomes 1111, the highest number that can be counted in a fourdigit binary counter, the output signal $S_K$ of the AND gate 6 to rise suddenly from "0" to "1" to reverse the flip-flop circuit 4, changing $S_Q$ to "0" and $\bar{S}_Q$ to "1". This causes the code $(I_D I_C I_B I_A)$ to be reversed from 0011 to 1100. When the output code $(Q_D Q_C Q_B Q_A)$ of the counter 1 is 1111 and signal $S_Q$ is "0" and the pulse $\bar{S}_P$ rises to "1", the output signal $S_M$ of the NAND gate 76 becomes "0", so that the signal $S_L$ becomes "0", which causes the input code 1100 to be written in the counter 1. This changes the output code $(Q_D Q_C Q_B Q_A)$ of the counter 1 to 1100, and the counter starts to count from that value. The signal $S_M$ goes to the "0" level for only an instant, because the change in the putput code $(Q_D Q_C Q_B Q_A)$ from 1111 to 1100 drops the output signal $S_K$ of the AND gate 6 from the "1" level to the "0" level, and this change in the level of signal $S_K$ causes the output of the NAND gate 76 to rise to the "1" level, thereby causing the output signal $S_L$ of the AND gate also to rise to "1". Thus, signals $S_M$ and $S_L$, which dropped to "0" when the pulse $\bar{S}_P$ rose to "1" (corresponding to the drop of the signal $S_P$ from "1" to "0"), almost immediately return to the "1" level.

When the output code of the counter 1 reaches 1111 again, the signal $S_K$ again becomes 1, causing the output signals $S_Q$ and $\bar{S}_Q$ of the flip-flop circuit 4 to be again reversed, back to their original levels of "1" and "0", respectively, so that the input code $(I_A I_B I_C I_D)$ to the counter 1 is again reversed in polarity from 0011 back to 1100. The reversal of the flip-flop 4 making signal $S_Q$ return to the level "1" causes the output of the inverted 75 to drop to the "0" level, which makes it impossible for the output of the NAND gate 76 to drop to "0", even for an instant.

The pulse generator 3 continues, and the next pulse $S_P$ causes the output code $(Q_D Q_C Q_B Q_A)$ of the counter 1 to shift one more step, which takes the count from 1111 to 0000. At this count, the output signals of all four of the inverters 72A–72D are at the "1" level, as is the signal $S_Q$, so that when the signal $S_P$ returns to "0" after having shifted the count output of the counter 1 from 1111 to 0000, the inverted signal $\bar{S}_P$ from the inverter 71 rises to "1". All input signals to the NAND gate 73 are, at that instant, at the "1" level, which is the necessary condition for the output signal $S_N$ to drop to "0", forcing the signal $S_L$ from the AND gate 77 to drop to "0".

As in the previous drop of the signal $S_L$ to "0", the counter 1 thereby has the binary signal at its terminals loaded into it. This signal is the original signal 0011, and so the counter 1 again starts to count from 0011. Thereafter, every time the output code $(Q_D Q_C Q_B Q_A)$ of the counter 1 becomes 1111, the flip-flop circuit 4 is reversed as mentioned above, and the pulse width of the output signal of the flip-flop circuit 4, that is, of the signal $\bar{S}_Q$ in this example, is obtained as an analog amount corresponding to the input code 0011, that is, decimal number "3". This signal is applied to the low pass filter 5 to be rectified so that a signal with constant level corresponding to the input code can be obtained.

As mentions above, according to this invention, an output signal having a pulse width as an analog amount corresponding to an input code can be obtained with a quite simple circuit. In addition, an integrated circuit therefor can also be formed with ease.

What is claimed is:

1. A digital-to-analog converter comprising: a pulse generator providing counting pulses; a single n-bit counter connected with said generator for counting said pulses and having n-parallel loading terminals and output terminals; a flip-flop circuit adapted to be triggered successively to alternating first and second states; n-input terminals for receiving respective bits of an incoming n-bit digital signal to be converted; a polarity reversing circuit having n-channels each connecting a respective one of said input terminals with a respective one of said loading terminals of the counter, each of said channels being controllable by said flip-flop circuit to apply the respective bit of the incoming digital signal to the respective loading terminal with its polarity reversed in response to said first state and with its polarity unchanged in response to said second state of the flip-flop circuit so that said loading terminals have the complement of said incoming digital signal and the true incoming digital signal alternatively applied thereto in said first and second states, respectively; first logic circuit means connected to said output terminals of the counter for triggering said flip-flop circuit each time said counter counts said pulses up to overflow; second logic circuit means for providing a loading signal by which said counter is preset in accordance with the bits then applied to said loading terminals, said second logic circuit means being connected with said pulse generator, said output terminals and said flip-flop circuit to provide said loading signal at predetermined intervals following the triggering of said flip-flop circuit to said first and second states, respectively, so that said counter is made to count up to overflow alternately from a preset to said complement of the incoming digital signal and from a preset to said true incoming digital signal; and low pass filter means connected to said flip-flop circuit and being responsive to said alternating first and second states thereof to provide therefrom an analog signal having a duty cycle which corresponds to said incoming digital signal to be converted.

2. The digital-to-analog converter according to claim 1; in which each channel of said polarity reversing circuit includes an inverter connected to said respective input terminal to reverse the polarity of a bit applied to said respective input terminal; a first AND gate having a first input connected to said respective input terminal and a second input connected to a normal output of said flip-flop circuit; a second AND gate having a first input connected to said inverter and a second input connected to an inverted output of said flip-flop circuit; and an OR gate having two inputs connected to outputs of said first and second AND gates, an output of said OR gate being connected to a respective loading terminal of said counter.

3. The digital-to-analog converter according to claim 1; in which said first logic circuit means includes an AND gate having n inputs each connected to one of said output terminals of said counter and an output connected to said flip-flop circuit.

4. The digital-to-analog converter according to claim 3; in which said second logic circuit means includes a second AND gate having an output connected to said counter to provide said loading signal to said counter when the output of said second AND gate drops to "0", and first and second inputs; a first NAND gate having an output connected to said second input of said second AND gate, a first input connected to the first mentioned AND gate to receive signals from said output of the latter, a second input connected to said pulse generator to receive a signal opposite in polarity to each counting pulse from said pulse generator, and a third input receiving an output from said flip-flop circuit; a second NAND gate having n + 2 terminals; means connecting a first one of said n + 2 terminals to said pulse generator so as to apply to said one terminal said signal opposite in polarity to said counting pulse; means connecting n of said n + 2 terminals to respective ones of said n output terminals of said counter to receive output signals from said counter; and means connecting the remaining one of said n + 2 terminals to an output of said flip-flop circuit which is of opposite polarity to said output thereof applied to said third input of said first NAND gate.

* * * * *